(12) United States Patent
Thai et al.

(10) Patent No.: US 8,063,473 B1
(45) Date of Patent: Nov. 22, 2011

(54) NANOPHOTONIC TRANSCEIVER

(75) Inventors: Serey Thai, Glen Burnie, MD (US);
Paul R. de la Houssaye, San Diego, CA (US); Randy L. Shimabukuro, Kapolei, HI (US); Stephen D. Russell, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1131 days.

(21) Appl. No.: 11/001,597

(22) Filed: Nov. 29, 2004

(51) Int. Cl.
*H01L 23/02* (2006.01)
(52) U.S. Cl. ........ 257/678; 257/680; 257/729; 257/730; 257/E23.009; 257/E31.117
(58) Field of Classification Search .................. 257/678, 257/680, 729, 730, E23.009, E31.117; 250/239, 250/214.1, 551; 398/138, 139
See application file for complete search history.

(56) References Cited

U.S. PATENT DOCUMENTS

| | | | | |
|---|---|---|---|---|
| 5,299,046 A | * | 3/1994 | Spaeth et al. | 398/135 |
| 5,432,358 A | * | 7/1995 | Nelson et al. | 257/81 |
| 5,633,527 A | * | 5/1997 | Lear | 257/432 |
| 5,886,374 A | * | 3/1999 | Sakamoto et al. | 257/292 |
| 6,531,767 B2 | * | 3/2003 | Shrauger | 257/678 |
| 2002/0134918 A1 | * | 9/2002 | Miida | 250/214.1 |
| 2003/0168964 A1 | * | 9/2003 | Chen | 313/495 |
| 2003/0218119 A1 | * | 11/2003 | Stegmuller | 250/214.1 |
| 2004/0125704 A1 | * | 7/2004 | Ishi et al. | 369/13.05 |
| 2004/0264537 A1 | * | 12/2004 | Jackson | 372/50 |
| 2005/0053319 A1 | * | 3/2005 | Doan | 385/14 |
| 2005/0133476 A1 | * | 6/2005 | Islam et al. | 216/2 |
| 2005/0147343 A1 | * | 7/2005 | Nakada et al. | 385/14 |
| 2006/0243961 A1 | * | 11/2006 | Levi et al. | 257/21 |
| 2010/0027947 A1 | * | 2/2010 | Dutta | 385/88 |

OTHER PUBLICATIONS

Houssaye et al. "Nanophotonic Applications for Silicon-on-Insulator (SOI)", Jul. 6, 2004, Quantum Sensing and Nanophotonic Device, SPIE vol. 5359, pp. 145-152.*

* cited by examiner

*Primary Examiner* — Zandra V. Smith
*Assistant Examiner* — Telly D Green
(74) *Attorney, Agent, or Firm* — Kyle Eppele; Arthur K. Samora

(57) ABSTRACT

A nanophotonic device. The device includes a substrate, at least one light emitting structure and at least one electronic component. The at least one light emitting structure is capable of transmitting light and is monolithically integrated on the substrate. The at least one electronic component is monolithically integrated on the substrate. A method for fabricating nanophotonic devices is also described.

7 Claims, 7 Drawing Sheets

NANOPHOTONIC TRANSCEIVER

BACKGROUND OF THE INVENTION

The present invention is generally in the field of microelectronics.

Typical microelectronic photonic transceivers lack a light source that is monolithically integrated with electronic components. Thus, typical microelectronic photonic transceivers are relatively large, heavy and costly to manufacture. In addition, typical microelectronic photonic transceivers lack scalability.

A need exists for microelectronic photonic transceivers that are easily scalable and have reduced size, weight and cost to manufacture.

DETAILED DESCRIPTION OF THE INVENTION

The present invention is directed to Nanophotonic Transceivers. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Definitions

The following definitions and acronyms are used herein:

Acronym(s)

CMOS—Complementary Metal Oxide Semiconductor
NP—NanoPhotonic
NPD—NanoPhotonic Device
NPTR—NanoPhotonic TRansceiver
EC—Electronic Component
LES—Light Emitting Structure
CVD—Chemical Vapor Deposition
SPE—Solid-Phase Epitaxy
RIE—Reactive Ion Etching
NEMS—Nano Electro Mechanical Structures
MEMS—Micro Electro Mechanical Structures
OEC—Opto-Electronic Component

Definition(s)

Light Emitting Structure—a device capable of emitting light under electrical or optical excitation.

Electronic Component—a non-light emitting device that is fabricated from materials that may include semiconductors, conductors, insulators and dielectrics to control the flow of electrical charge.

The nanophotonic device (NPD) includes at least one light emitting structure (LES) and at least one electronic component (EC). The NPD can comprise a plurality of configurations. In one embodiment, the NPD has reduced size. In one embodiment, the NPD has reduced weight. In one embodiment, the NPD has reduced cost to manufacture. In one embodiment, the NPD has increased ease of scalability.

Figure 1:
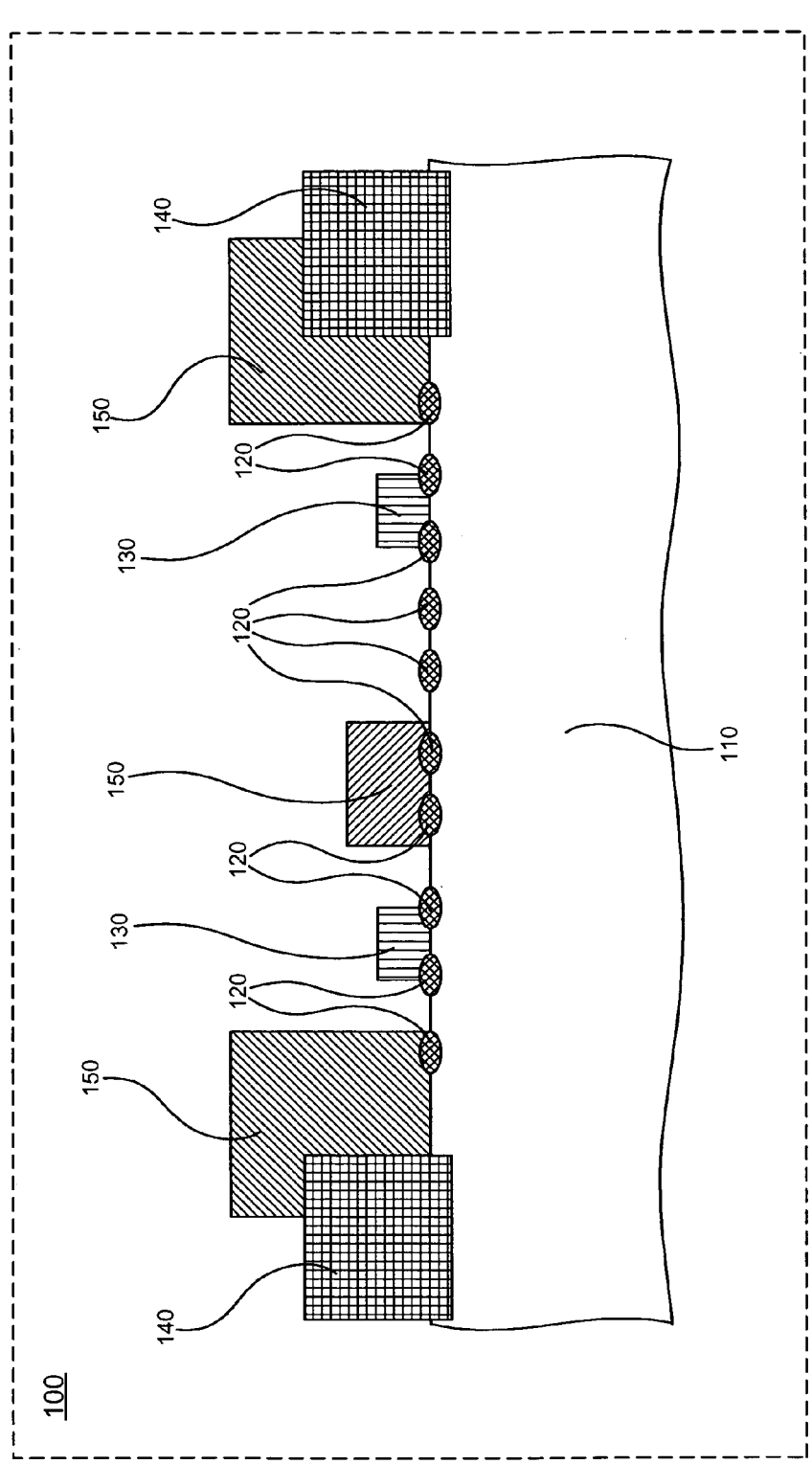
FIG. 1 is a side view of one embodiment of a nanophotonic device.

FIG. 1 is a side view of one embodiment of a NPD. As shown in FIG. 1, NPD 100 includes substrate 110, light emitting structures (LES) 120, optical interconnects 130, configured electronics 140 and conductive interconnects 150. As shown on FIG. 1, LES 120 are monolithically integrated with EC (e.g., optical interconnects 130, configured electronics 140 and conductive interconnects 150) on substrate 110. EC work in conjunction with LES 120 to form a monolithically integrated photoelectronic device capable of performing various functions depending on the electronic components. Exemplary EC include CMOS circuitry, and exemplary OEC include NEMS, MEMS, light modulators, lead-zirconate-tantalate class of electro-optic materials and bismuth tantalate based materials.

Substrate 110 comprises an insulator material. In one embodiment, substrate 110 comprises a non-transparent insulator material. In one embodiment, substrate 110 comprises a semi-transparent insulator material. In one embodiment, substrate 110 comprises a transparent insulator material. In one embodiment, substrate 110 comprises sapphire ($Al_2O_3$). In one embodiment, substrate 110 is transparent to selected electromagnetic frequencies. LES 120 comprise semiconductor material such as, for example, silicon, germanium, Group IV semiconductors, Group III-V semiconductors, Group II-VI semiconductors and other composite semiconductor material. LES 120 have dimensions consistent with providing an effective band gap, which enables light-emitting capabilities though electron excitation. In one embodiment, LES 120 have dimensions in the sub-micron or nanometer range (i.e., less than approximately one micron). In one embodiment, LES 120 have cross-sectional areas less than approximately five nanometers. In one embodiment, LES 120 comprise lateral nanowires. In one embodiment, LES 120 are operatively coupled to a direct current source, which provides electron excitation, and thus, light-emitting capabilities. In one embodiment, LES 120 comprise (100)-oriented silicon deposited over substrate 100, which comprises r-plane crystalline sapphire. In one embodiment, surface states of LES 120 are tailored through a passivation step during processing, which affects light emissions. In one embodiment, LES 120 are planar. In one embodiment, LES 120 are non-planar.

Optical interconnects 130 comprise light propagating material. Optical interconnects 130 provide operative coupling between optical components such as LES 120 and photodetectors. Examples of optical interconnects 130 include optical waveguides and fiber optic cable. Configured electronics 140 can comprise semiconductor, conductor, insulator and dielectric materials. Configured electronics 140 provide functionality depending on device application. For example, in a nanophotonic transceiver (NPTR) embodiment, configured electronics 140 comprise drive electronics. Examples of configured electronics 140 include MOSFETs, MESFETs, bipolar transistors, VLSI circuits, timing circuitry and modulators. Interconnects 150 comprise conductive material such as metal (such as Al, Au, Cu), doped semiconductors (such as As-doped silicon, P-doped silicon, B-doped silicon), or conductive alloys (such as ITO, SnO, titanium silicide) formed in single or multilayer stacks. Interconnects 150 provide operative coupling between components such as LES 120 and configured electronics 140.

An exemplary general method of forming NPD 100 is now described. The exemplary general method of forming NPD 100 includes two steps: (a) form LES on substrate; and (b) form EC on substrate. Those skilled in the art shall recognize that the two steps can be performed in any order including simultaneously and contemporaneously without departing from the scope or spirit of the NPD. In one embodiment, LES are formed prior to forming EC. In one embodiment, LES are formed after forming EC. In one embodiment, LES and EC are formed contemporaneously. LES and EC can be formed by processes such as deposition, photolithography and etching, which are now described with reference to FIGS. 2 and 3A-3H.

Figure 2:
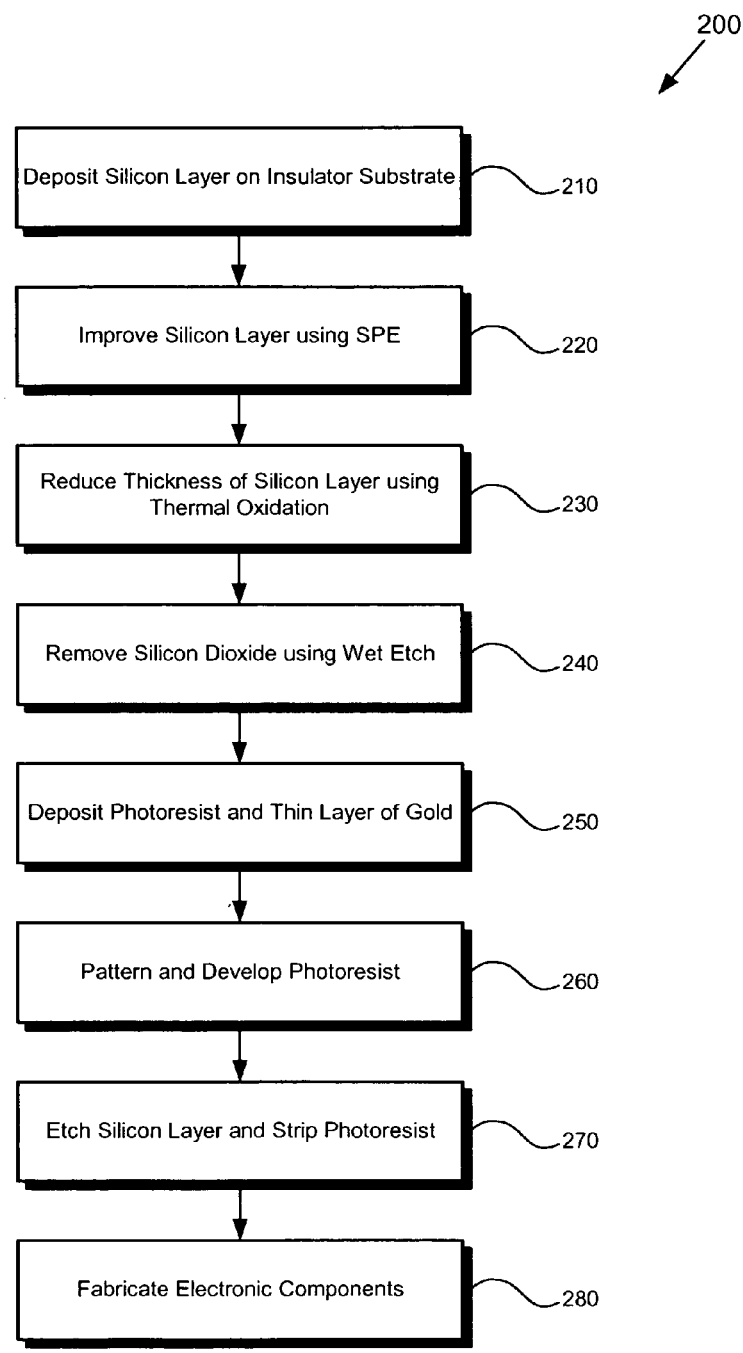
FIG. 2 is a flowchart of an exemplary method of manufacturing one embodiment of a nanophotonic device.

FIG. 2 is a flowchart illustrating exemplary process steps taken to implement an exemplary NPD. Certain details and features have been left out of flowchart 200 of FIG. 2 that are apparent to a person of ordinary skill in the art. For example, a step may consist of one or more sub-steps or may involve specialized equipment or materials, as known in the art. While STEPS 210 through 280 shown in flowchart 200 are sufficient to describe one embodiment of the NPD, other embodiments of the NPD may utilize steps different from those shown in flowchart 200.

FIGS. 3A-3H are side views of some of the features of an exemplary NPD in intermediate stages of fabrication, formed in accordance with one embodiment of the NPD. These fabrication stages are described in detail below in relation to flowchart 200 of FIG. 2. Although the embodiment of FIGS. 2 and 3A-3H are described with silicon as a semiconductor material for fabricating LES, those skilled in the art shall recognize that semiconductor material other than silicon can be used without departing from the scope and spirit of the NPD. Exemplary semiconductor material for fabricating LES includes germanium, Group IV semiconductors and compound semiconductor materials. In relation to the exemplary general method, STEPS 210-270 and FIGS. 3A-3G correspond to STEP (a) "form LES on substrate" and STEP 280 and FIG. 3H correspond to STEP (b) "form EC on substrate."

Figure 3A:
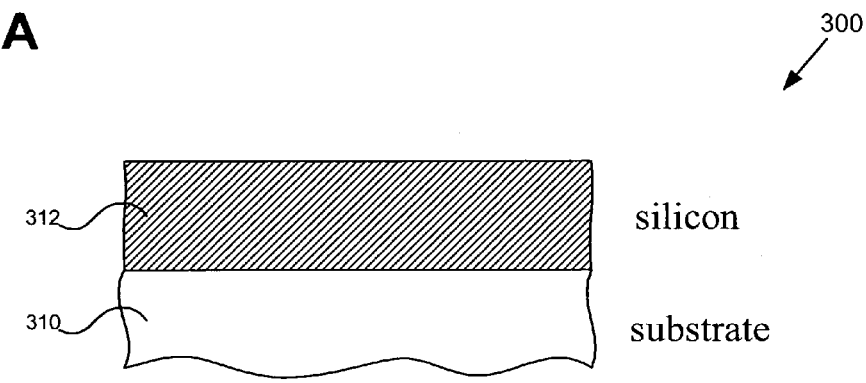
FIG. 3A is a side view of some of the features of an exemplary nanophotonic device formed in accordance with one embodiment of a nanophotonic device.

Referring to FIGS. 2 and 3A, at STEP 210 in flowchart 200, the method deposits silicon layer 312 on insulator substrate 310 of NPD 300. In one embodiment, STEP 210 comprises depositing silicon layer 312 on insulator substrate 310 using a chemical vapor deposition (CVD) technique. In one embodiment, STEP 210 comprises depositing (100)-oriented silicon on r-plane crystalline sapphire using CVD. In one embodiment, silicon layer 312 comprises single crystalline silicon. In one embodiment, insulator substrate 310 comprises sapphire. After STEP 210, the method proceeds to STEP 220.

Figure 3B:
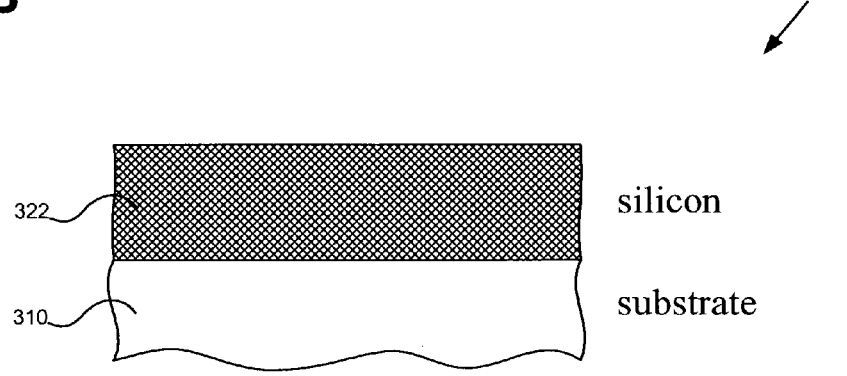
FIG. 3B is a side view of some of the features of an exemplary nanophotonic device formed in accordance with one embodiment of a nanophotonic device.

Referring to FIGS. 2 and 3A-3B, at STEP 220 in flowchart 200, the method improves silicon layer 312 of NPD 300 using a solid-phase epitaxy (SPE) process to form improved silicon layer 322. The improved silicon layer has reduced defects near the silicon-sapphire interface thereby enabling formation of a NPD adjacent to the interface. After STEP 220, the method proceeds to STEP 230.

Figure 3C:
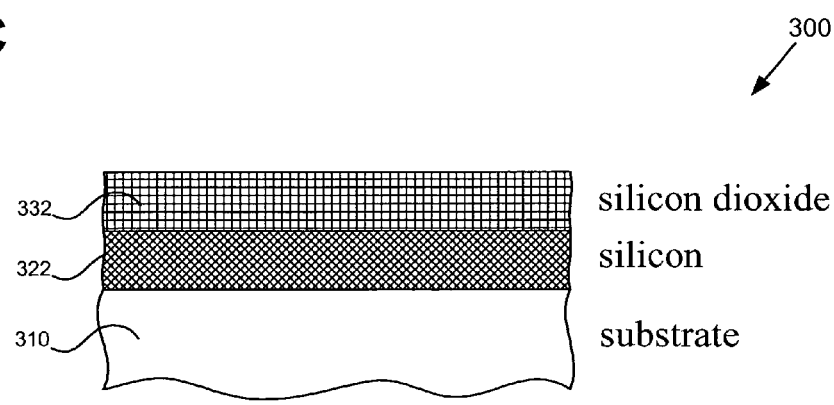
FIG. 3C is a side view of some of the features of an exemplary nanophotonic device formed in accordance with one embodiment of a nanophotonic device.

Referring to FIGS. 2 and 3C, at STEP 230 in flowchart 200, the method reduces the thickness of silicon layer 312 of NPD 300 using thermal oxidation, which forms an oxide layer. In embodiments having silicon as a semiconductor, thermal oxidation forms silicon dioxide layer 332. After STEP 230, the method proceeds to STEP 240.

Figure 3D:
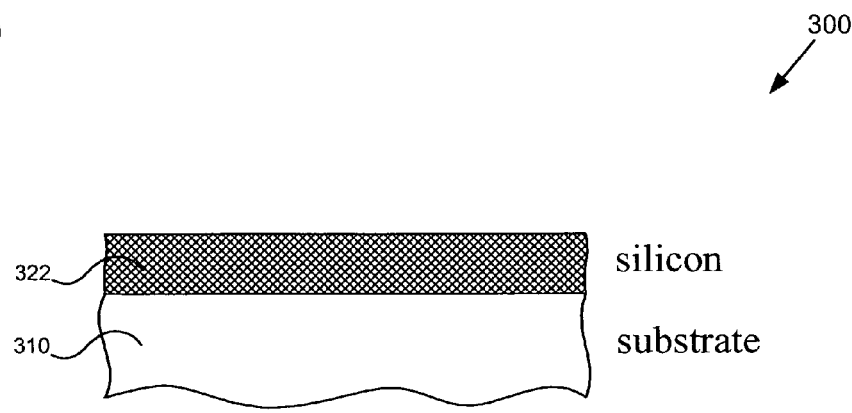
FIG. 3D is a side view of some of the features of an exemplary nanophotonic device formed in accordance with one embodiment of a nanophotonic device.

Referring to FIGS. 2 and 3C-3D, at STEP 240 in flowchart 200, the method removes silicon dioxide layer 332 of NPD 300 using a wet etch process. In one embodiment, the method uses a hydrofluoric acid solution as a wet etch chemical. After STEP 240, the method proceeds to STEP 250.

Figure 3E:
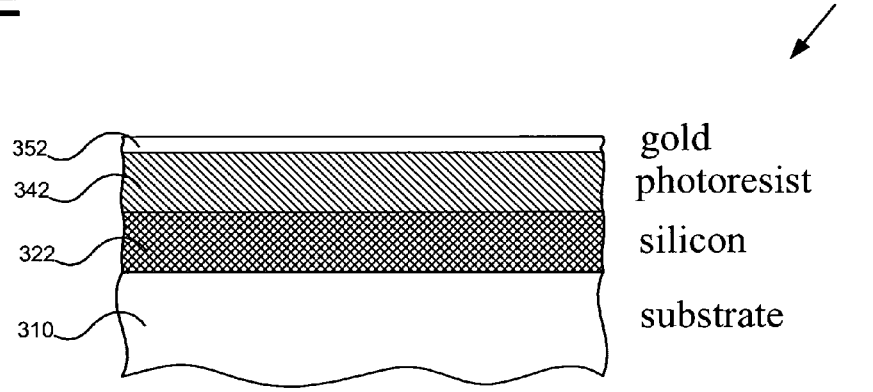
FIG. 3E is a side view of some of the features of an exemplary nanophotonic device formed in accordance with one embodiment of a nanophotonic device.

Referring to FIGS. 2 and 3E, at STEP 250 in flowchart 200, the method deposits photoresist 342 and, if desired, a thin layer of gold 352 on NPD 300. In one embodiment, the method deposits photoresist 342 using a spin-cast technique. In one embodiment, the method deposits thin layer of gold 352 using evaporation or sputtering techniques. The thin layer of gold is preferred if subsequent patterning steps employ electron-beam lithography. For optical or x-ray lithography the gold may be omitted. After STEP 250, the method proceeds to STEP 260.

Figure 3F:
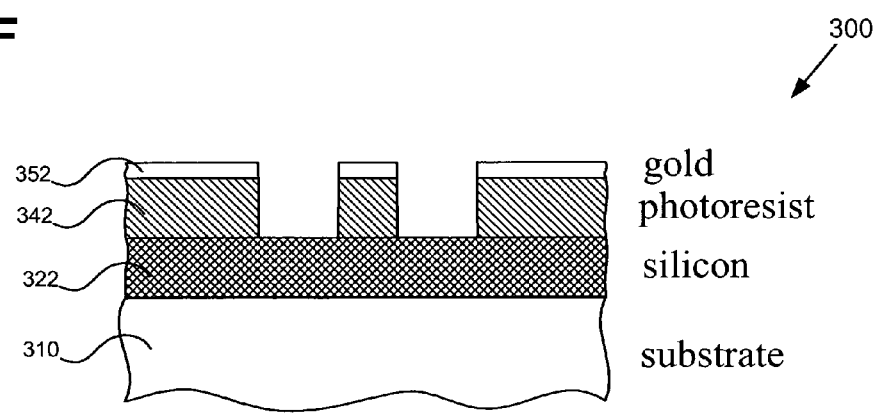
FIG. 3F is a side view of some of the features of an exemplary nanophotonic device formed in accordance with one embodiment of a nanophotonic device.

Referring to FIGS. 2 and 3F, at STEP 260 in flowchart 200, the method patterns and develops photoresist 342 (and as required the thin layer of gold 352). In one embodiment, the method uses electron-beam patterning on NPD 300. After STEP 260, the method proceeds to STEP 270.

Figure 3G:
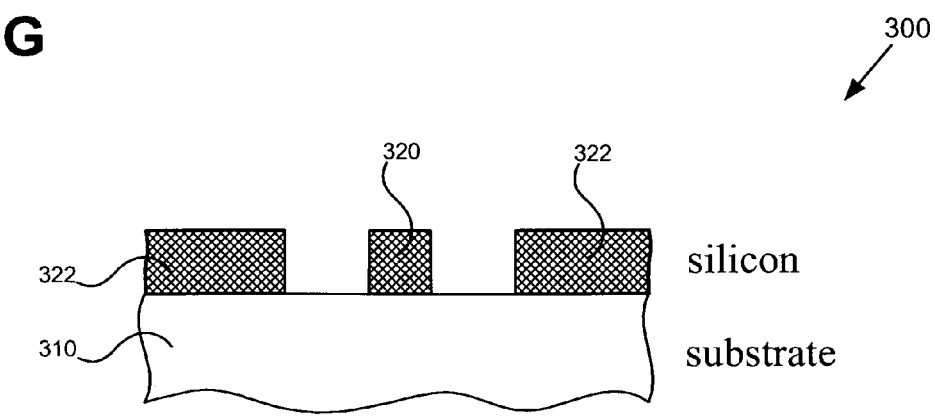
FIG. 3G is a side view of some of the features of an exemplary nanophotonic device formed in accordance with one embodiment of a nanophotonic device.

Referring to FIGS. 2 and 3F-3G, at STEP 270 in flowchart 200, the method etches improved silicon layer 322 and strips photoresist 342. In one embodiment, the method uses reactive ion etching (RIE) to etch improved silicon layer 322. In one embodiment, the method uses anisotropic wet chemical etching to etch improved silicon layer 322. As shown in FIG. 3G, NPD 300 includes LES 320 after the method completes STEP 270. In one embodiment, the method at STEP 270 also tailors surface states of LES 320 using a passivation process, which affects light emission.

In one embodiment, the method at STEP 270 further includes sub-steps producing a reduced microscopically smoother unaltered layer, which are performed after stripping photoresist 342. In one embodiment, the method at STEP 270 further includes chemically altering the surface of the semiconductor layer through interaction with a gas, which is performed after stripping photoresist 342. In one embodiment, the method at STEP 270 further includes oxidation and/or nitridation sub-steps performed after stripping photoresist 342 wherein the oxidation and/or nitridation sub-steps can be performed multiples times in various orders and/or simultaneously in one step forming an oxynitride. For example, an oxidation sub-step can be followed by a nitridation sub-step, which can be followed by a second oxidation sub-step. In another example, a nitridation sub-step can be followed by an oxidation sub-step, which can be followed by a second oxidation sub-step. In another example, through changing flow rates of oxygen and nitrogen during such a simultaneous sub-step, an oxynitride is formed with specific characteristics determined by the time and temperature corresponding to the flow rates during the process. Specific process parameters, such as flow rates and times will be dependent upon the processing equipment and will be evident to those familiar with semiconductor processing based upon the teachings herein. In one embodiment, oxidation and/or nitridation sub-steps comprise at least partially self-limiting oxidation and/or nitridation sub-steps. These oxidation and/or nitridation sub-steps can be followed by removal of oxide and/or nitride, which helps reduce both dimension and dimensional variation of LES 320 of FIGS. 3G-3H in a controllable manner. Such additional sub-steps help form a LES having increased light emission efficiency through microscale design. The oxidation and/or nitridation sub-steps can be preceded by ion implantation sub-steps to help improve oxidation and nitridation. For example, an ion implantation sub-step can be used to help define areas of increased rates of oxidation and nitridation. In addition, an ion implantation sub-step can be used to guide the progress of oxidation and nitridation.

Exemplary embodiments of STEP 270 having oxidation and nitridation sub-steps are now described. In one embodiment, the method at STEP 270 comprises the following sub-steps: (1) etches improved silicon layer 322; (2) strips photoresist 342; (3) producing a reduced microscopically smoother unaltered layer by chemically altering the surface of silicon layer 322 with a gas. In one embodiment, the method at STEP 270 comprises the following sub-steps: (1) etches improved silicon layer 322; (2) strips photoresist 342; (3) producing a reduced microscopically smoother unaltered layer by chemically altering the surface of silicon layer 322 with a gas; (4) removing the chemically altered surface of silicon layer 322. In one embodiment, the method at STEP 270 comprises the following sub-steps: (1) etches improved silicon layer 322; (2) strips photoresist 342; (3) implanting ions in silicon layer 322; (4) producing a reduced microscopically smoother unaltered layer by chemically altering the surface of silicon layer 322 with a gas. In one embodiment, the method at STEP 270 comprises the following sub-steps: (1) etches improved silicon layer 322; (2) strips photoresist 342; (3) oxidizes the surface of silicon layer 322. In one embodiment, the method at STEP 270 comprises the following sub-steps: (1) etches improved silicon layer 322; (2) strips photoresist 342; (3) nitridizes the surface of silicon layer 322. In one embodiment, the method at STEP 270 comprises the following sub-steps: (1) etches improved silicon layer 322; (2) strips photoresist 342; (3) performing a series of oxidizing and nitiridizing sub-steps to oxidize and nitridize the surface of silicon layer 322. In one embodiment, the method at STEP 270 comprises the following sub-steps: (1) etches improved silicon layer 322; (2) strips photoresist 342; (3) oxidizes the surface of silicon layer 322; (4) removes oxides. In one embodiment, the method at STEP 270 comprises the following sub-steps: (1) etches improved silicon layer 322; (2) strips photoresist 342; (3) nitridizes the surface of silicon layer 322; (4) removes nitrides. In one embodiment, the method at STEP 270 comprises the following sub-steps: (1) etches improved silicon layer 322; (2) strips photoresist 342; (3) implants ions in silicon layer 322; (4) oxidizes the surface of silicon layer 322; (5) nitridizes the surface of silicon layer 322. In one embodiment, the method at STEP 270 comprises the following sub-steps: (1) etches improved silicon layer 322; (2) strips photoresist 342; (3) implants ions in silicon layer 322; (4) oxidizes the surface of silicon layer 322; (5) nitridizes the surface of silicon layer 322; (6) removes oxides and nitrides. In one embodiment, the method at STEP 270 comprises the following sub-steps: (1) etches improved silicon layer 322; (2) strips photoresist 342; (3) implants ions in silicon layer 322; (4) implants ions in silicon layer 322; (5) oxidizes the surface of silicon layer 322; (6) nitridizes the surface of silicon layer 322; (7) removes oxides and nitrides. After STEP 270, the method proceeds to STEP 280.

Figure 3H:
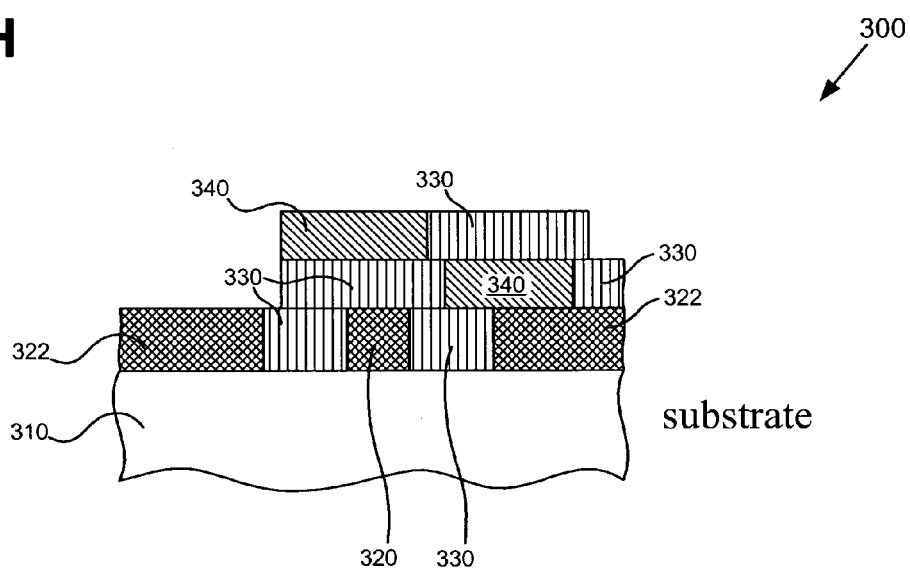
FIG. 3H is a side view of some of the features of an exemplary nanophotonic device formed in accordance with one embodiment of a nanophotonic device.

Referring to FIGS. 2 and 3H, at STEP 280 in flowchart 200, the method fabricates electronic components on NPD 300. In one embodiment, the method fabricates optical interconnects 330 and configured electronics 340 on NPD 300. In one embodiment, the method fabricates NEMS, MEMS and light modulators. After STEP 280, the method terminates and the devices may be packaged as desired.

For example, in a wafer-processing embodiment, the method of flowchart 200 of FIG. 2 includes an additional step of dicing a wafer, which can be performed before or after any step of flowchart 200. In one embodiment, the method performs the additional step of dicing a wafer after STEP 280 of flowchart 200 of FIG. 2. In one embodiment, the method dices the wafer into chips, wherein each chip has an area of approximately one square centimeter. The chips may be subsequently packaged individually or in a plurality.

Figure 4:
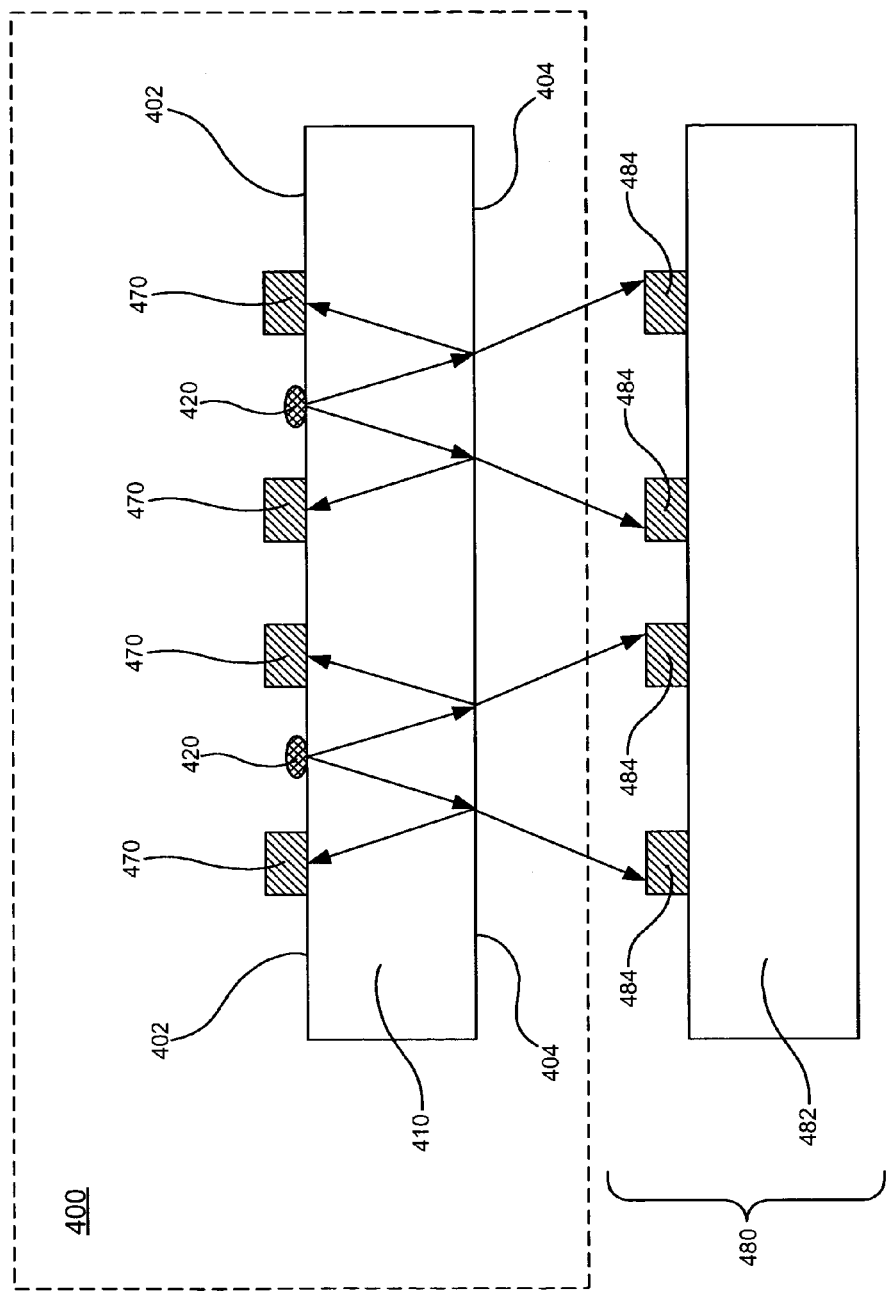
FIG. 4 is a side view of one embodiment of an exemplary nanophotonic device.

FIG. 4 is a side view of one embodiment of an exemplary nanophotonic device. The exemplary embodiment NPD of FIG. 4 uses LES, photodetectors and the at-least semi-transparent properties of an insulating substrate to transmit and receive light. As shown in FIG. 4, NPD 400 includes at-least semi-transparent insulating substrate 410, LES 420 and photodetectors 470. The at-least semitransparent substrate may be semitransparent or transparent to wavelengths of interest. In one embodiment, substrate 410 comprises sapphire. Substrate 410 has top surface 402 and bottom surface 404. As shown in FIG. 4, LES 420 emit light (represented by arrows) through substrate 410. Bottom surface 404 allows part of the light to pass and reflects part of the light back to top surface 404.

Photodetectors 470 are capable of receiving and detecting light. In one embodiment of NPD 400, photodetectors 470 receive and detect light transmitted from LES 420 and reflected off bottom surface 404. In one embodiment of NPD 400, bottom surface 404 includes photodetectors (not shown in any of the FIGURES), which receive and detect light. In one embodiment of NPD 400, light passed through bottom surface 404 is detected by photodetectors on a separate device. For example, photodetector device 480 is situated below bottom surface 404 or optically coupled to NPD 400 and includes photodetectors 484 and substrate 482. In one embodiment, substrate 482 comprises transparent insulator material, and thus, can pass light generated by LES 420 that passes through bottom surface 404. Photodetectors 484 of photodetector device 480 receive and detect light passed through bottom surface 404.

Figure 5:
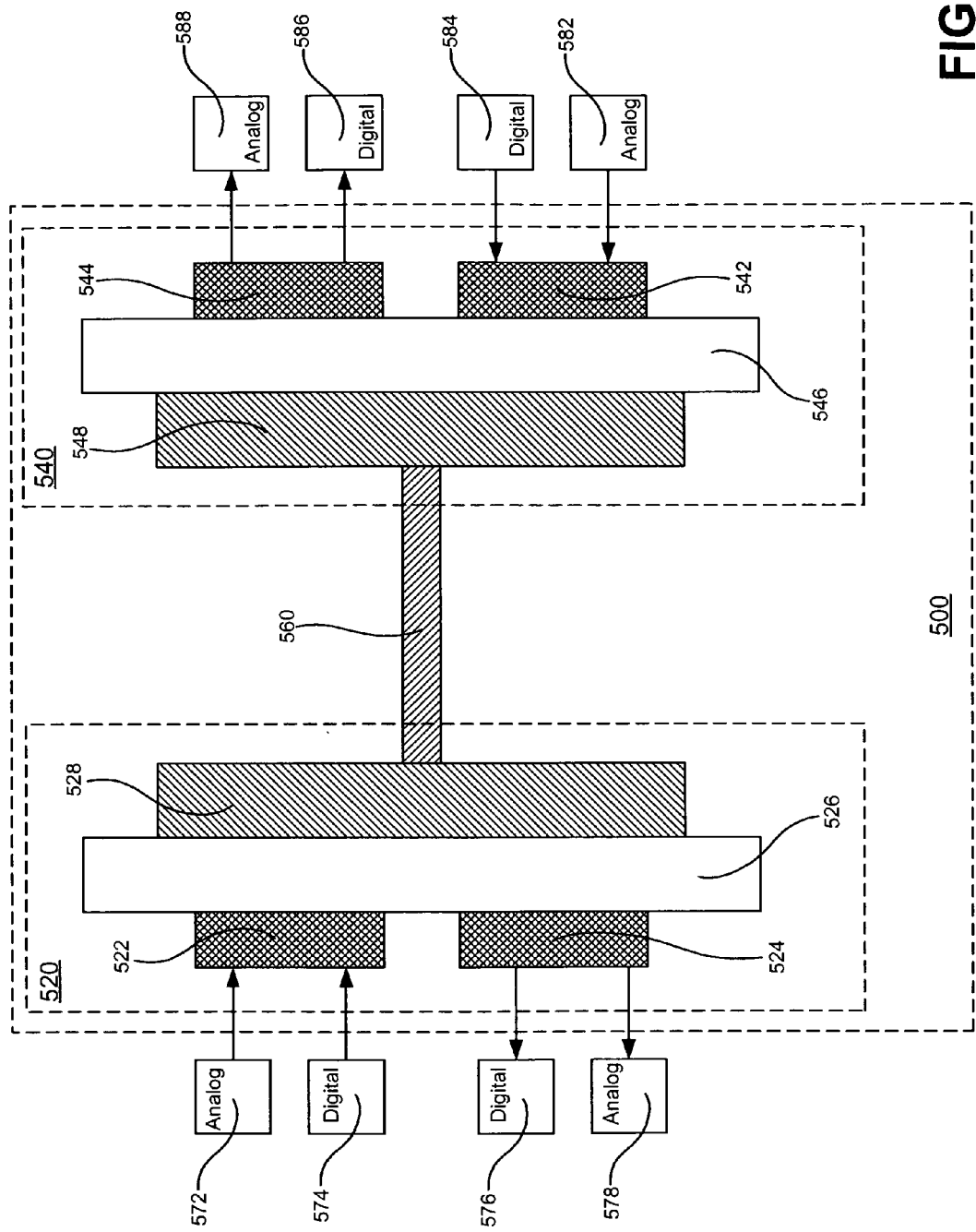
FIG. 5 is a block diagram of an exemplary implementation of one embodiment of an exemplary nanophotonic transceiver.

FIG. 5 is a block diagram of an exemplary implementation of one embodiment of an exemplary nanophotonic transceiver. The exemplary implementation of FIG. 5 uses NPD having transparent substrates, analog circuits, photodetectors and digital circuits to transmit and receive multi-signal communication channels (e.g., analog, optical and digital) in parallel. As shown in FIG. 5, NPTR 500 includes NPD 520, NPD 540 and optical communication medium 560. Optical communication medium 560 provides operative coupling between NPD 520 and NPD 540 so that light can be transmitted and received between them. Exemplary optical communication mediums 560 include fiber ribbon cables, optical waveguides and air. NPD 520 includes transmit array 522, receive array 524, transparent substrate 526 and coupler 528. Transmit array 522 and receive array 524 are monolithically integrated on transparent substrate 526. Transmit array 522 is capable of receiving analog and digital signals from analog source 572 and digital source 574, respectively, via communication channels and converting the signals to optical signals. In one embodiment, analog source 572 comprises an analog transmitter and digital source 574 comprises a digital transmitter. Transmit array 522 is capable of transmitting optical signals through transparent substrate 526 to coupler 528, which are eventually input to receive array 544 of NPD 540. Receive array 524 is capable of receiving optical signals from coupler 528 through transparent substrate 526 and converting the signals to analog and/or digital signals. Receive array 524 is capable of transmitting analog and digital signals to analog receiver 578 and digital receiver 576, respectively, via communication channels.

NPD 540 includes transmit array 542, receive array 544, transparent substrate 546 and coupler 548. Transmit array 542 and receive array 544 are monolithically integrated on transparent substrate 546. Transmit array 542 is capable of receiving analog and digital signals from analog source 582 and digital source 584, respectively, via communication channels and converting the signals to optical signals. In one embodiment, analog source 582 comprises an analog receiver. Transmit array 542 is capable of transmitting optical signals through transparent substrate 546 to coupler 548, which are eventually input to receive array 524 of NPD 520. Receive array 544 is capable of receiving optical signals from coupler 548 through transparent substrate 546 and converting the signals to analog and/or digital signals. Receive array 544 is capable of transmitting analog and digital signals to analog receiver 588 and digital receiver 586, respectively, via communication channels. In one embodiment, analog receiver 588 comprises an analog transmitter.

In one embodiment, NPTR 500 uses optical interconnects of an optical fiber ribbon cable to interface NPD with on-chip detectors and mixed-signal electronics. In one embodiment, NPTR 500 is used for multi-functional rf analog optical links and high-capacity digital data transmission for very short distance interconnections. Thus, NPTR 500 can implement wideband microwave/millimeter wave antenna remoting and data communication in a parallel manner, which allows data and rf signals to be transmitted on separate channels as well as received on separate channels.

From the above description of the invention, it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

We claim:

1. A nanophotonic transceiver device comprising:
   a) a sapphire substrate;
   b) at least one planar light source;
   c) at least one photodetector;
   d) at least one optical waveguide for operatively coupling said at least one planar light source and said at least one photodetector;
   e) at least one electronic component; and,
   f) wherein said at least one planar light source, said at least one photodetector, said at least one electronic component and said optical waveguide are all monolithically direct contact with the same said sapphire substrate.

2. The nanophotonic device of claim 1, wherein said at least one planar light source comprises semiconductor material.

3. The nanophotonic device of claim 1, wherein said at least one planar light source has dimensions consistent with providing an effective band gap for producing light emissions.

4. The nanophotonic device of claim 1, wherein said at least one planar light source comprise lateral nanowires.

5. The nanophotonic device of claim 1, wherein said substrate comprises insulator material.

6. The nanophotonic device of claim 1, wherein said substrate comprises transparent material.

7. The nanophotonic device of claim 1, wherein said substrate comprises semi-transparent material.

* * * * *